United States Patent
Lee et al.

(10) Patent No.: US 6,703,663 B1
(45) Date of Patent: Mar. 9, 2004

(54) CMOS DEVICE USING ADDITIONAL IMPLANT REGIONS TO ENHANCE ESD PERFORMANCE AND DEVICE MANUFACTURED THEREBY

(75) Inventors: Jian-Hsing Lee, Hsin-Chu (TW); Yi-Hsun Wu, Hsin-Chu (TW); Jian-Ren Shih, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 99 days.

(21) Appl. No.: 09/655,086

(22) Filed: Sep. 5, 2000

Related U.S. Application Data

(62) Division of application No. 09/031,653, filed on Feb. 27, 1998, now Pat. No. 6,171,891.

(51) Int. Cl.[7] .................................................. H01L 29/76
(52) U.S. Cl. ............................................ 257/336; 257/338
(58) Field of Search ............................. 257/388, 314, 257/550, 548, 335, 264, 336, 591, 338

(56) References Cited

U.S. PATENT DOCUMENTS

| | | | |
|---|---|---|---|
| 5,130,760 A | 7/1992 | Matzen et al. | 357/1.3 |
| 5,493,142 A | 2/1996 | Randazzo et al. | 257/328 |
| 5,514,611 A | 5/1996 | Kim et al. | 437/48 |
| 5,559,352 A | 9/1996 | Hsue et al. | 257/328 |
| 5,677,224 A * | 10/1997 | Kadosh et al. | 437/57 |
| 6,043,129 A * | 3/2000 | Choi et al. | 438/300 |
| 6,051,471 A * | 4/2000 | Gardner et al. | 438/286 |
| 6,150,687 A * | 11/2000 | Noble et al. | 257/302 |

\* cited by examiner

*Primary Examiner*—Amir Zarabian
*Assistant Examiner*—Kiesha Rose
(74) *Attorney, Agent, or Firm*—George O. Saile; Stephen B. Ackerman; Graham S. Jones, II

(57) ABSTRACT

A method of forming a semiconductor memory device formed on a semiconductor substrate with an N-well and a P-well comprises the following steps. Form over a substrate the combination of a gate oxide layer and a gate layer patterned into gate stacks with sidewalls for an NMOS FET device over a P-well in the substrate and a PMOS FET device over an N-well. Form P− lightly doped S/D regions in the N-well and N− lightly doped S/D regions in the P-well. Form spacers on the sidewalls of the gate stacks. Thereafter form deep N− lightly doped S/D regions in the P-well, and form deep P− lightly doped S/D regions in the N-well. Form heavily doped P++ regions self-aligned with the gate below future P+ S/D sites to be formed self-aligned with the spacers in the N-well, and form heavily doped N++ regions self-aligned with the gate below future N+ S/D sites to be formed self-aligned with the spacers in the P-well.

10 Claims, 8 Drawing Sheets

US 6,703,663 B1

CMOS DEVICE USING ADDITIONAL IMPLANT REGIONS TO ENHANCE ESD PERFORMANCE AND DEVICE MANUFACTURED THEREBY

This is a division of patent application Ser. No. 09/031,653, filing date Feb. 27, 1998 now U.S. Pat. No. 6,171,891, Method Of Manufacture Of Cmos Device Using Additional Implant Regions To Enhance Esd Performance And Device Manufactured Thereby, assigned to the same assignee as the present invention.

BACKGROUND OF THE INVENTION

1. Field of the Invention

This invention relates to semiconductor memory devices and more particularly to CMOS devices with enhanced ESD performance.

2. Description of Related Art

Junction leakage and junction short circuits to the substrate are more and more likely to occur in advanced technology devices as the dimensions of the devices forming those circuits become smaller and smaller.

U.S. Pat. No. 5,514,611 of Kim et al. for "Method for Manufacturing a Semiconductor Memory Device Having a Read-Only Memory Cell" shows a S/D (source/drain) structure with three I/I (Ion Implanted) doped regions.

U.S. Pat. No. 5,559,352 of Hsue for "ESD Protection Improvement" shows an ESD circuit with three I/I doped regions.

U.S. Pat. No. 5,493,142 of Randazzo et al. for "Input/Output Transistors with Optimized ESD Protection" has a lightly doped region disposed near the gate and the surface of the substrate. A sidewall oxide layer is selectively etched to extend laterally from a gate by a significant amount. The sidewall oxide layer is also etched on an opposite side of the gate and may extend laterally an appreciable amount in that direction. Heavily doped S/D regions are implanted in the substrate. The extent of the sidewall oxide, and thus the lightly doped regions separating the gate from the drain and source, can be tailored to optimize ESD protection and performance characteristics for a given application by defocusing snapback conduction.

U.S. Pat. No. 5,130,760 of Matzen et al. for "Bidirectional Surge Suppressor Zener Diode Circuit With a Guard Ring" describes a semiconductor device incorporating doped regions of a substrate and epitaxial layers which result in a dual Zener diode arrangement having the Zener diodes associated in an opposite polarity arrangement.

SUMMARY OF THE INVENTION

A semiconductor memory device is formed on a semiconductor substrate with an N-well and a P-well. The combination of a gate oxide layer and a gate electrode layer are formed over a substrate and patterned into gate electrode stacks with sidewalls for an NMOS FET device over a P-well in the substrate and a PMOS FET device over an N-well. P– lightly doped source/drain regions are formed in the N-well. N– lightly doped source/drain regions are formed in the P-well. Spacers are formed on the sidewalls of the gate electrode stacks. Heavily doped P++ regions self-aligned with the gate electrode were formed below future P+ source/drain sites to be formed self-aligned with the spacers in the N-well, and heavily doped N++ regions self-aligned with the gate electrode were formed below future N+ source/drain sites to be formed self-aligned with the spacers in the P-well. Deep N– lightly doped source/drain regions were formed in the N-well directly below the P++ regions. Deep P– lightly doped source/drain regions were formed in the P-well directly below the N++ regions.

The N+ type source/drain regions were formed in the P-well in the source/drain sites. The P+ type source/drain regions were formed in the N-well in the source/drain sites. Refractory metal silicide layers were formed over the gate electrode layers.

The refractory metal silicide layers were formed over the source/drain regions, P–/N++ junctions were formed below the N+ source/drain regions in the P-well, and N–/P++ junctions were formed below the P+ source/drain regions in the N-well.

The deep lightly doped N– and P– regions are formed to a depth from about 0.2 $\mu$m to about 0.3 $\mu$m below the surface of the substrate, and the counterdoped N++ and P++ regions are formed to a depth from about 0.1 $\mu$m to about 0.2 $\mu$m below the surface of the substrate.

Preferably, the deep lightly doped N– and P– regions are formed to a depth from about 0.2 $\mu$m to about 0.3 $\mu$m below the surface of the substrate, with a concentration of phosphorus, $P^{31}$, dopant in the N– regions from about 1 E 17 atoms/cm$^3$ to about 1 E 18 atoms/cm$^3$.

There is a concentration of boron, B, dopant in the P– regions from about 1 E 17 atoms/cm$^3$ to about 1 E 18 atoms/cm$^3$ The counterdoped N++ and P++ regions are formed to a depth from about 0.1 $\mu$m to about 0.2 $\mu$m below the surface of the substrate.

There is a concentration of phosphorus, $P^{31}$, or arsenic, As, dopant in the N++ regions from about 5 E 20 atoms/cm$^3$ to about 1 E 21 atoms/cm$^3$ and a concentration of boron, B, dopant in the P++ regions from about 5 E 20 atoms/cm$^3$ to about 1 E 21 atoms/cm$^3$.

The S/D regions are formed with a concentration of arsenic, As, dopant in the N+ regions from about 1 E 20 atoms/cm$^3$ to about 5 E 20 atoms/cm$^3$ and a concentration of boron, B, dopant in the P+ regions from about 1 E 20 atoms/cm$^3$ to about 5 E 20 atoms/cm$^3$.

The lightly doped S/D regions are formed with a concentration of phosphorus, $P^{31}$, or arsenic, As, dopant in the N– regions from about 1 E 18 atoms/cm$^3$ to about 1 E 20 atoms/cm$^3$ and a concentration of boron, B, dopant in the P– regions from about 1 E 18 atoms/cm$^3$ to about 1 E 20 atoms/cm$^3$.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figure 1:
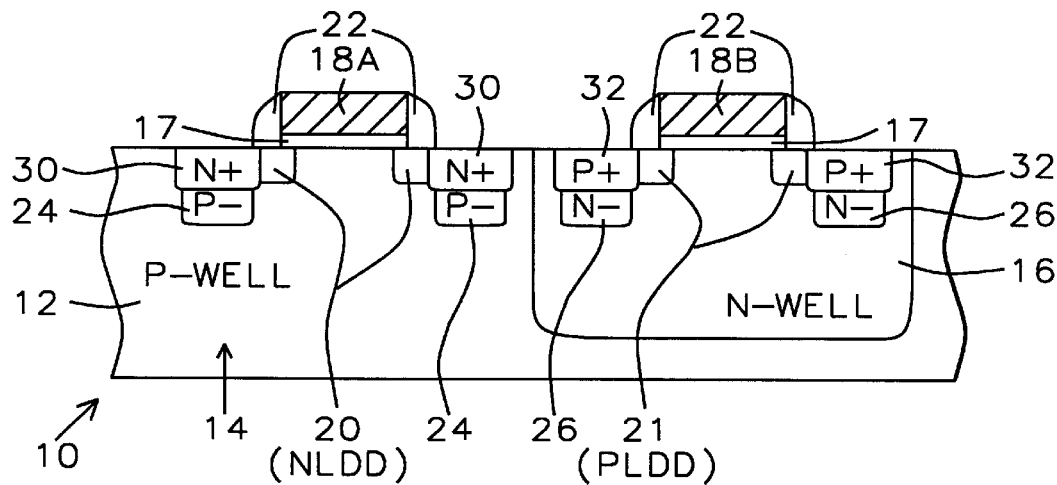
FIG. 1 shows a CMOS FET device with a P– doped substrate in which a P-well and an N-well are formed.
Figure 4:
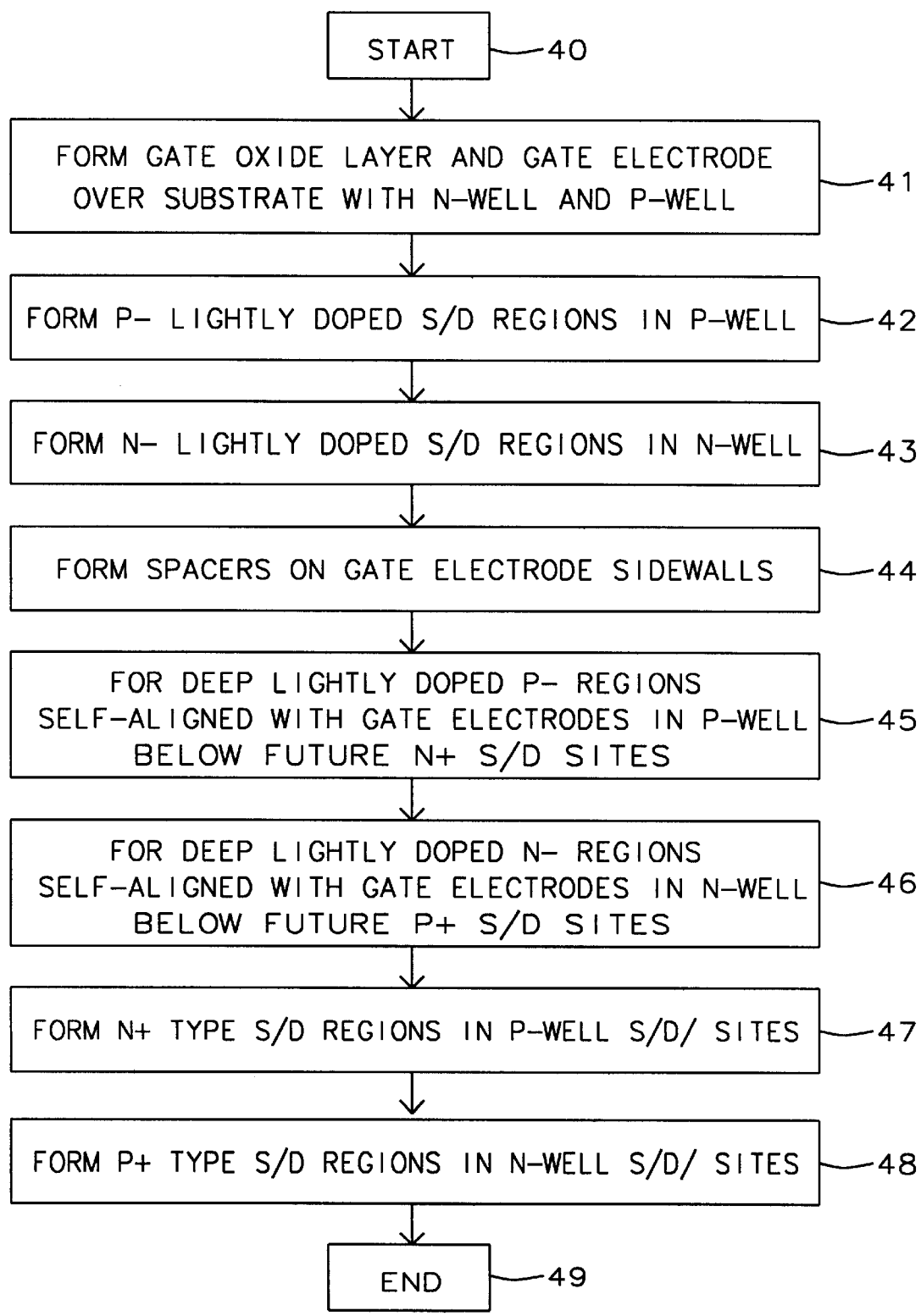
FIG. 4 shows the steps of the process for forming the device of FIG. 1.

FIG. 1 shows a CMOS FET device 10 with P– doped substrate 12 in which a P-well 14 and an N-well 16 are formed. In FIG. 4, the steps of the process for forming the device 10 of FIG. 1 are described. The process starts in step 40 with P– doped silicon semiconductor substrate 12.

In step 41, a gate oxide layer. 17 is formed on substrate 12 and layer 17 is covered with a doped polysilicon layer, which has been patterned along with gate oxide layer 17 into gate electrodes 18A and 18B.

In step 42, form a mask (not shown) and form PLDD (P– doped LDD) Lightly Doped Drain and source regions 21 in N-well 16 self-aligned with the gate electrode 18B.

In step 43, form a mask (not shown) and form NLDD (N– doped LDD) Lightly Doped Drain and source regions 20 in the P-well 14 self-aligned with the gate electrode 18A.

In step 44, form spacers 22 on sidewalls of gate electrodes 18A and 18B.

In step 45, form deep lightly doped N– regions 26 in N-well 16, self-aligned with gate electrode 18B and spacers 22. Lightly doped N– regions 26 are directly below the P+ S/D sites 32 (which were formed in the step 48, as described below), as shown in FIG. 1.

In step 46, form deep lightly doped P– regions 24 in P-well 14, self-aligned with gate electrode 18A and spacers 22. Lightly doped P– regions 24 are directly below the N+ S/D sites 30 (which were formed in the step 47, as described below), as shown in FIG. 1.

In step 47, form N+ type S/D regions 30 in P-well 14 self-aligned with gate electrode 18A and spacers 22 and directly above P– regions 24.

In step 48, form P+ type S/D regions 32 in N-well 16 self-aligned with gate electrode 18B and spacers 22 and directly above N– regions 26.

In step 49, END the process of FIGS. 1 and 4.

Figure 2:
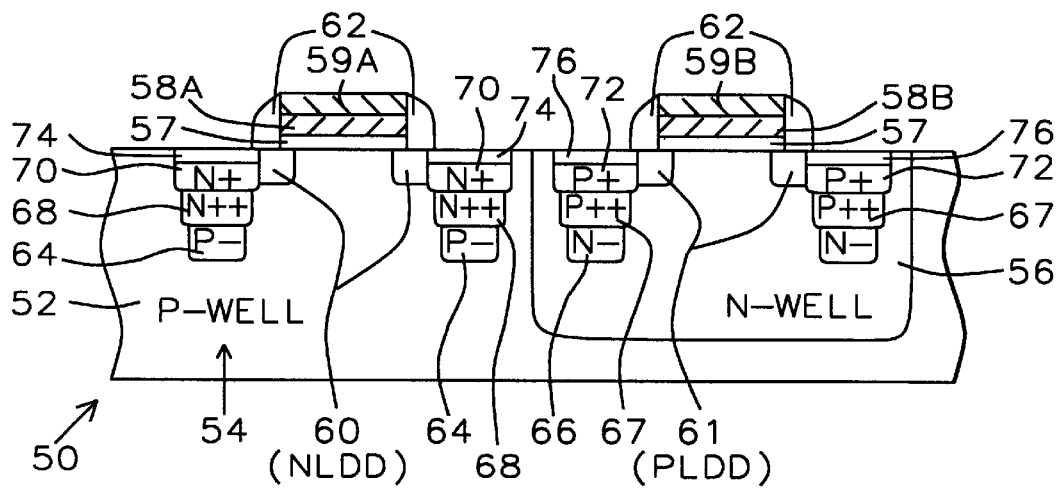
FIG. 2 shows an alternative CMOS FET device with P– doped substrate in which a P-well and an N-well are formed.
Figure 5A:
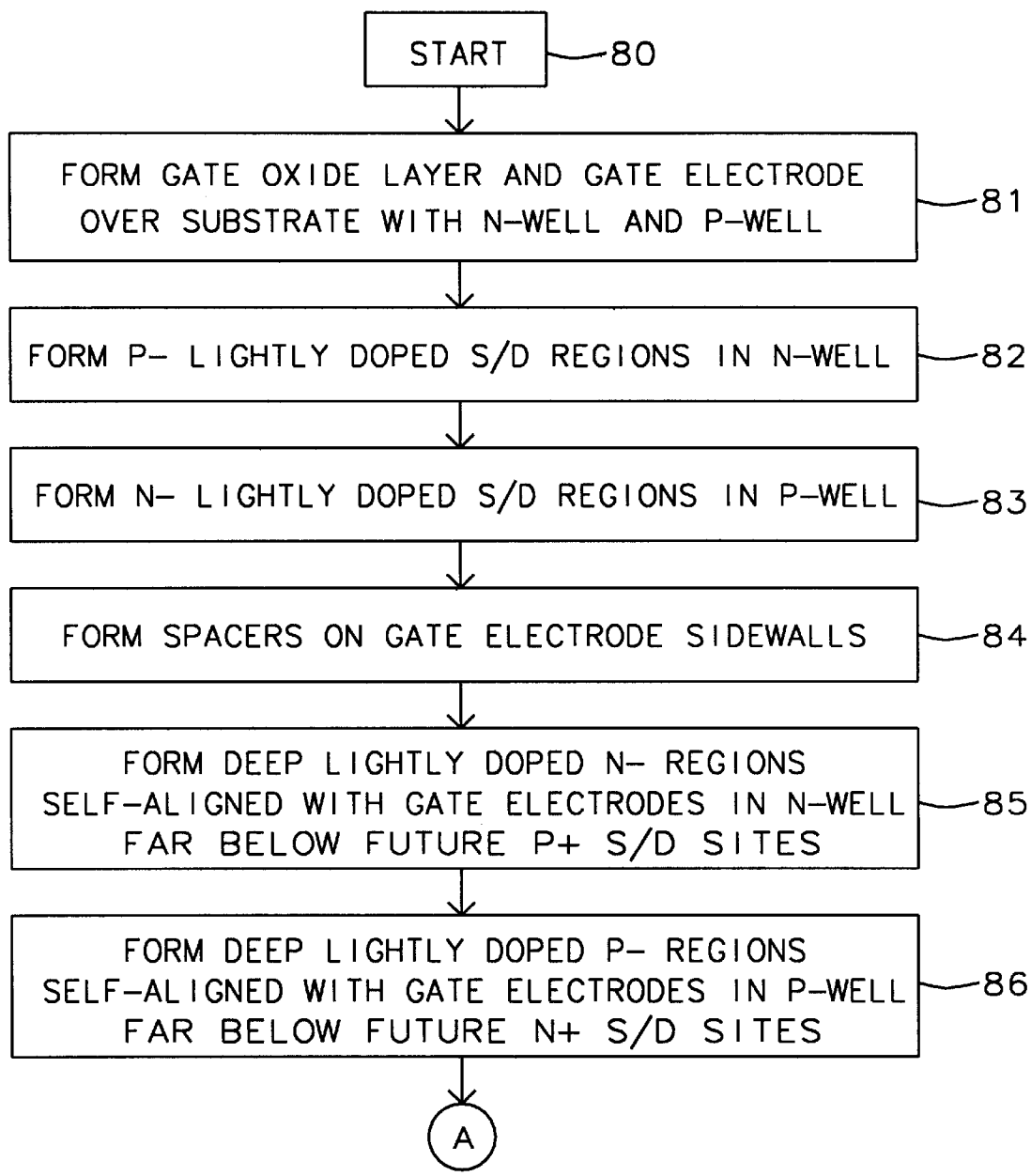
FIGS. 5A and 5B show the steps of the process for forming the devices of FIGS. 2 and 3.
Figure 5B:
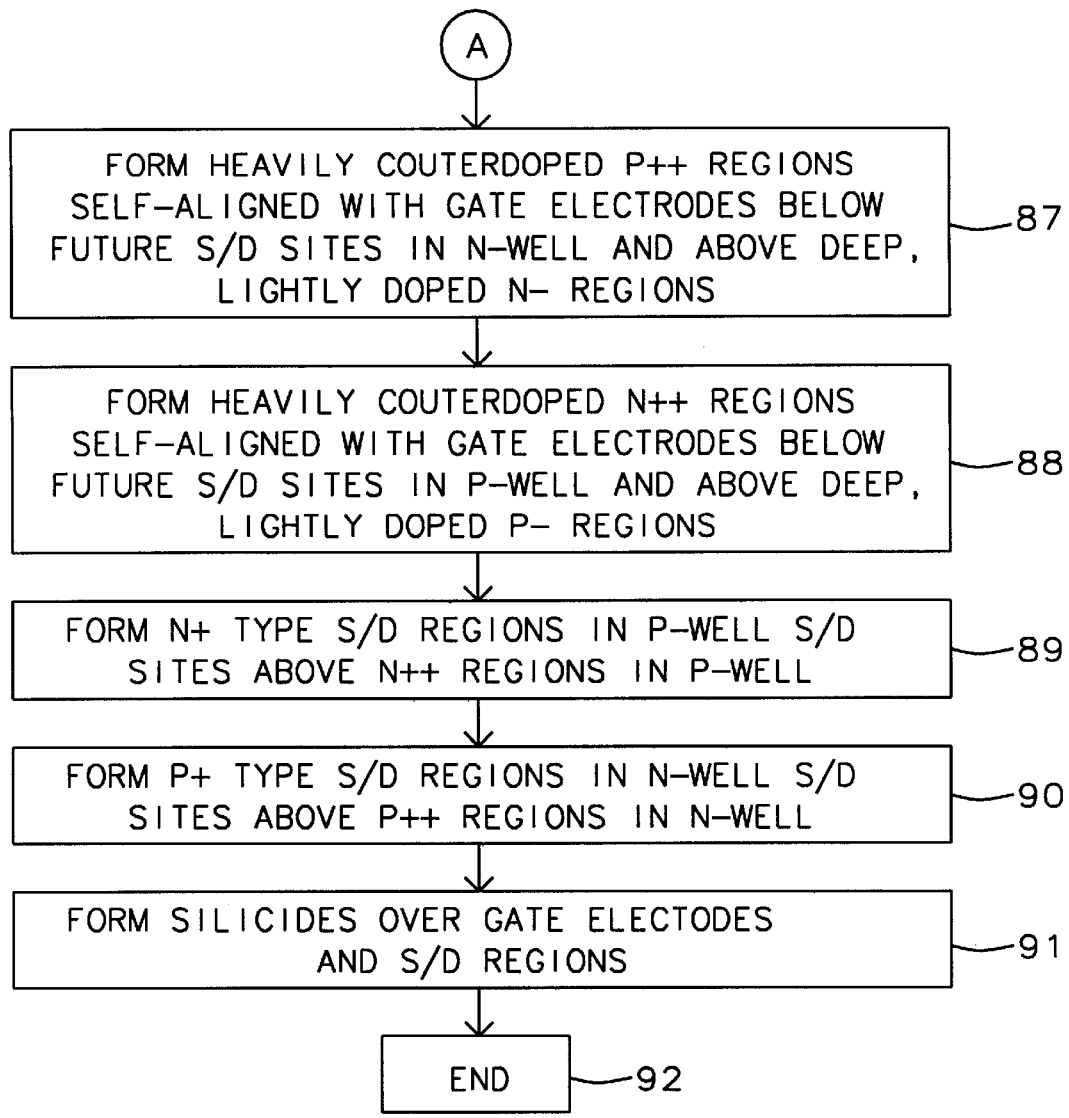

FIG. 2 shows a CMOS FET device 50 with P– doped substrate 52 in which a P-well 54 and an N-well+56 are formed. In FIGS. 5A and 5B, the steps of the process for forming the device 50 of FIG. 2 are described. The process starts in step 80 with a P– doped silicon semiconductor substrate 52.

In step 81, a gate oxide layer 57 is formed on substrate 53 which contains an N-well 56 and a P-well 54. The gate oxide layer 57 is covered with a doped polysilicon layer which has been patterned along with gate oxide layer 57 into doped polysilicon gate electrodes 58A and 58B in a pair of gate electrode stacks over substrate 52.

In step 82, form a mask (not shown) and form PLDD, Lightly Doped Drain, and source regions 61 in N-well 56 self-aligned with the gate electrode 58B.

The PLDD regions 61 were ion implanted with a dose of $BF_2$ dopant from about 1 E 13 ions/cm$^2$ to about 5 E 14 ions/cm$^2$ at an energy from about 5 keV to about 30 keV. After annealing the concentration of boron, B, dopant in the regions 61 was from about 1 E 18 atoms/cm$^3$ to about 1 E 20 atoms/cm$^3$.

In step 83, form an NLDD mask (not shown) and form LDD source and drain regions 60 in the P-well 14 self-aligned with the gate electrode 58A.

The NLDD regions 60 were ion implanted with a dose of phosphorus, $P^{31}$, or arsenic, As, dopant from about 1 E 13 ions/cm$^2$ to about 3 E 14 ions/cm$^2$ at an energy from about 10 keV to about 40 keV. After annealing the concentration of phosphorus, P, or arsenic, As, dopant in the NLDD regions 60 was from about 1 E 18 atoms/cm$^3$ to about 1 E 20 atoms/cm$^3$.

In step 84, form spacers 62 on sidewalls of gate electrodes 58A and 58B.

In step 85, form deep lightly doped N– regions 66 in N-well 56, self-aligned with gate electrode 58B and spacers 62. Lightly doped N– regions 66 are far below the P+ S/D sites 72 (which were formed in the step 90, as described below), as shown in FIG. 2.

The deep lightly doped N– regions 66 were ion implanted with a dose of phosphorus, $P^{31}$ dopant from about 1 E 12 ions/cm$^2$ to about 1 E 13 ions/cm$^2$ at an energy from about 50 keV to about 100 keV. After annealing the concentration of $P^{31}$ dopant in the regions 66 was from about 1 E 17 atoms/cm$^3$ to about 1 E 18 atoms/cm$^3$.

In step 86, form deep lightly doped P– regions 64 in P-well 54, self-aligned with gate electrode 58A and spacers 62. Lightly doped P– regions 64 are far below the N+ S/D sites 70 (which were formed in the step 89, as described below), as shown in FIG. 5B.

The deep lightly doped P– regions 64 were ion implanted with a dose of boron difluoride, $BF_2$ dopant from about 1 E 12 ions/cm$^2$ to about 1 E 13 ions/cm$^2$ at an energy from about 35 keV to about 70 keV. After annealing the concentration of boron, B, dopant in the regions 64 was from about 1 E 17 atoms/cm$^3$ to about 1 E 18 atoms/cm$^3$.

The deep lightly doped N– and P– regions are formed to a depth from about 2,000 Å (0.2 μm) to about 3,000 Å (0.3 μm) below the surface of the substrate 52.

In step 87 form heavily counterdoped P++ regions 67 self-aligned with gate electrodes 58A and spacers 62 directly below future P+ S/D) sites 72 in N-well 56 and above deep, lightly doped N– regions 66. Thus, the deep N– lightly doped source/drain regions 66 are formed in the N-well 56 directly below the future locations of the counterdoped P++ regions 67 which are located below the P+ doped source/drain regions 72, which are to be formed subsequently, as described below in connection with step 90 and above the deep N– lightly doped source/drain regions 66 (which were formed previously as described above in the N-well 56 in step 85).

The P++ regions 67 were ion implanted with $BF_2$ dopant dose from about 5 ions/cm$^2$ to about 1 E 16 ions/cm$^2$. After annealing the concentration of boron, B, dopant in the regions 70 was from about 5 E 20 atoms/cm$^3$ to about 1 E 21 atoms/cm$^3$.

In step 88 form heavily counterdoped N++ regions 68 self-aligned with gate electrodes 58B and spacers 62 below future N+ S/D sites 70 in P-well 54 and above deep, lightly doped P– regions 64. Thus, the deep P– lightly doped source/drain regions 64 are formed in the P-well 52 directly below the future locations of the counterdoped N++ regions 68 which are located below the N+ doped source drain regions 70, which are to be formed subsequently, as described below in connection with step 89 and above the deep P– lightly doped source/drain regions 64 (which were formed previously as described above in the P-well 52 in step 86).

The N++ regions 68 were ion implanted with a dose of arsenic, As, dopant from about 5 E 15 ions/cm$^2$ to about 1 E 16 ions/cm$^2$ at from about 50 keV to about 100 keV energy. After annealing the concentration of P or As dopant in the regions 68 was from about 5 E 20 atoms/cm$^3$ to about 1 E 21 atoms/cm$^3$. The counterdoped N++ and P++ regions are formed to a depth from about 1,000 Å to (0.1 μm) to about 2,000 Å (0.2 μm) below the surface of the substrate 52.

In step 89, N+ type S/D regions 70 were formed in P-well 54 directly above heavily counterdoped N++ regions 68 self-aligned with gate electrode 58A and spacers 62.

The N+ regions 70 were ion implanted with a dose of arsenic dopant from about 1 E 15 ions/cm$^2$ to about 5 E 15 ions/cm$^2$ at an energy from about 25 keV to about 50 keV. After annealing, the concentration of arsenic,. As, dopant in the regions 70 was from about 1 E 20 atoms/cm$^3$ to about 5 E 20 atoms/cm$^3$.

In step 90, P+ type S/D regions .72 were formed in N-well 56 directly above heavily counterdoped P++ regions 67 self-aligned with gate electrode 58B and spacers 62.

The P+ regions 72 were ion implanted with a dose of BF$_2$ dopant from about 1 E 15 ions/cm$^2$ to about 5 E 15 ions/cm$^2$ at an energy from about 20 keV to about 40 keV. After annealing, the concentration of boron, B, dopant in the regions 72 was from about 1 E 20 atoms/cm$^3$ to about 5 E 20 atoms/cm$^3$.

In step 91, form tungsten silicide layers 59A/59B over the gate electrode 58A/58B and titanium silicide layers 74/76 over the source/drain regions 74/76. The tungsten silicide layers 59A/59B are formed by the process of reaction between WF$_6$ and Si$_2$H$_2$. The silicides are selected from the group consisting of silicides of tungsten, cobalt, hafnium, molybdenum, nickel, palladium, platinum, tantalum, titanium, and zirconium.

In step 92, END the process of FIGS. 2, 5A and 5B.

As a result of the above process, the result shown in FIG. 2 is a CMOS FET device 50 with P− doped substrate 52 with a P-well 54 and an N-well 56 formed therein. A pair of P+ doped source/drain regions 72 are formed (see step 90) in N-well 56 self-aligned with the gate electrode 58B. Heavily counterdoped P++ regions 67 aligned with gate electrodes 58A and spacers 62 are formed (see step 87) directly below source/drain regions 72 in N-well 56. Lightly doped N− deep source/drain regions 66 are formed (see step 85) in N-well 56 directly below the heavily counterdoped P++ regions 67 and far below the P+ S/D sites 72. A pair of N+ doped source/drain S/D regions 70 are formed (see step 89) in the P-well 52 self-aligned with the gate electrode 58A. Heavily counterdoped N++ regions 68 aligned with gate electrodes 59A and spacers 62 are formed (see step 88) directly below S/D regions 70 in P-well 52. Lightly doped P− deep source/drain regions 64 are formed (see step 86) in the P-well directly below the heavily counterdoped N++ regions 68 and far below the N+ S/D sites 70. Thus, the deep P− lightly doped source/drain regions 64 are formed in the P-well 52 directly below the counterdoped N++ regions 68 which are located below the N+ doped source/drain regions 70, which are to be formed subsequently, as described below in connection with step 89.

Figure 3:
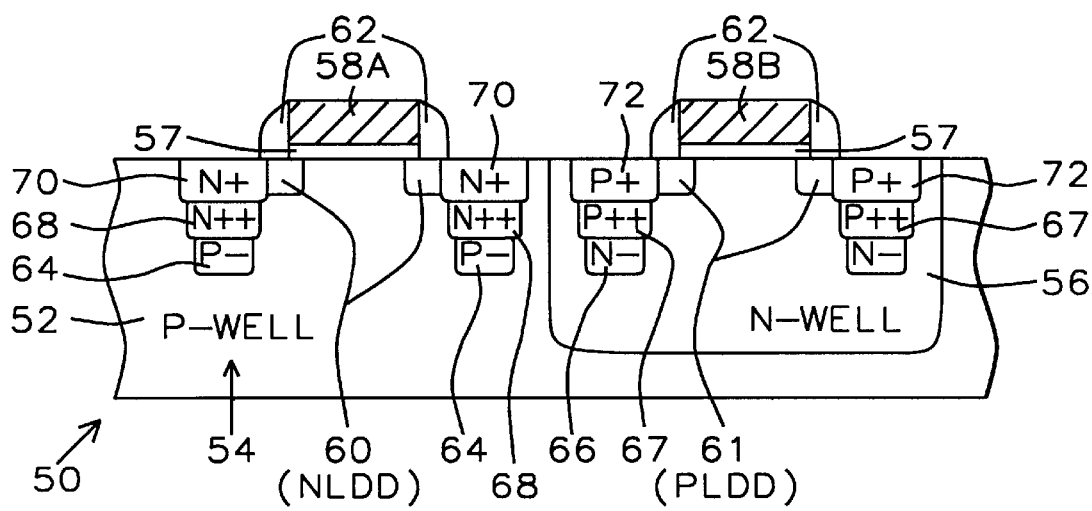
FIG. 3 shows the CMOS FET device of FIG. 2 with P– doped substrate in which a P-well and an N-well are formed, but without the silicide layers of FIG. 2

FIG. 3 shows the CMOS FET device 50 of FIG. 2 with P− doped substrate 53 in which a P-well and an N-well 16 are formed, but without the silicide layers 59A, 59B, 74 and 76. The process is the same as that of FIGS. 5A and 5B except that the step 91 is omitted.

Figure 6A:
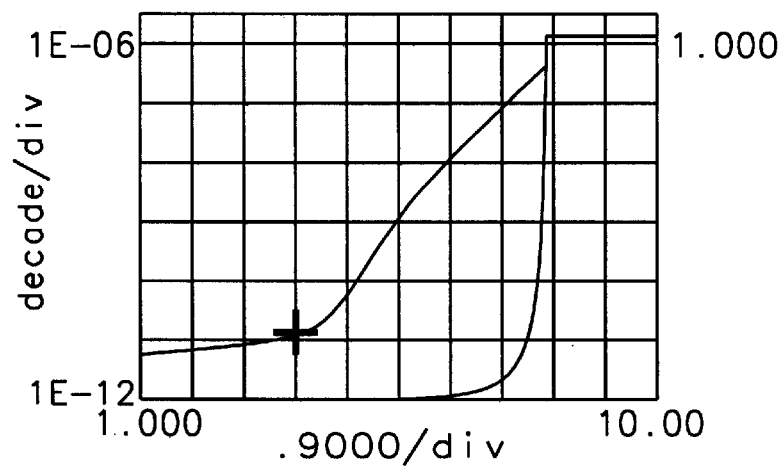
FIG. 6A shows a graph for the silicide arrangement of FIG. 2 with no boron ESD implant.

FIG. 6A shows a graph for the silicide arrangement of FIG. 2 with no boron, B, ESD implant.

Figure 6B:
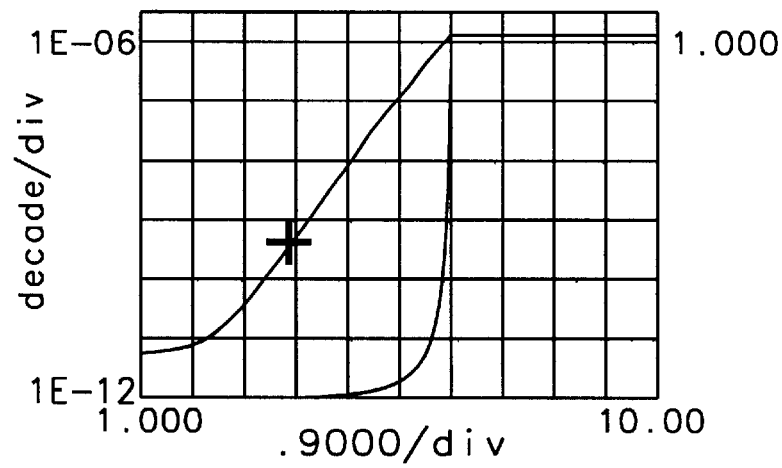
FIGS. 6B–6D show graphs for the silicide arrangement of FIG. 2 with boron ESD implants (B0), (B1), (B2).

FIG. 6B shows a graph for the silicide arrangement of FIG. 2 with a boron, B, ESD implant (B0).

Figure 6C:
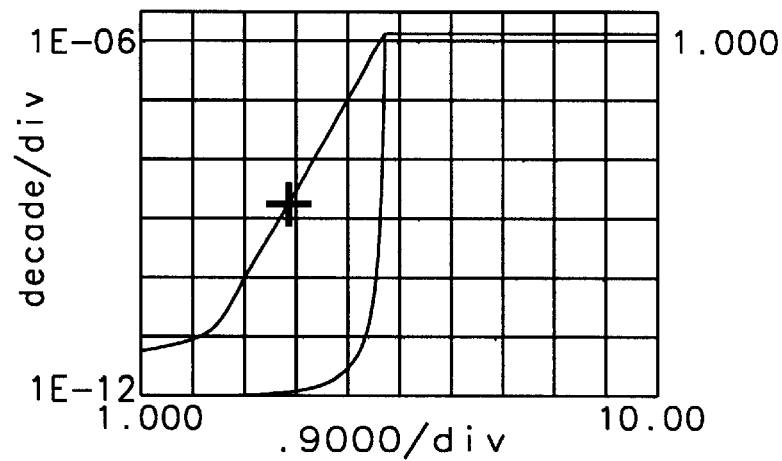

FIG. 6C shows a graph for the silicide arrangement of FIG. 2 with a boron, B, ESD implant (B1).

Figure 6D:
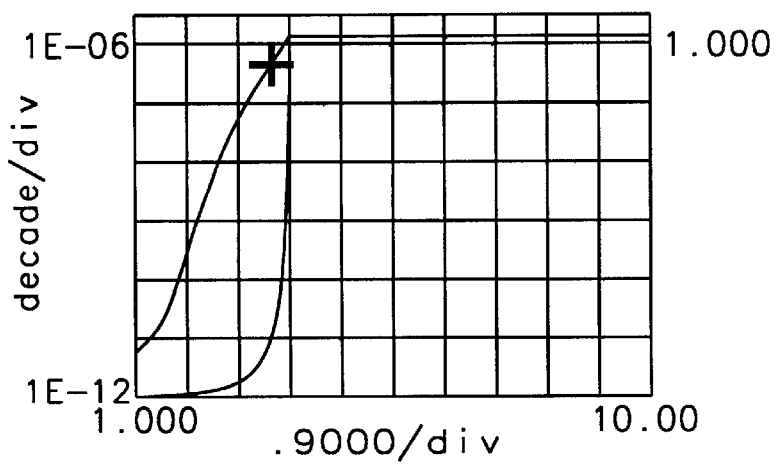

FIG. 6D shows a graph for the silicide arrangement of FIG. 2 with a boron, B, ESD implant (B2).

Figure 7A:
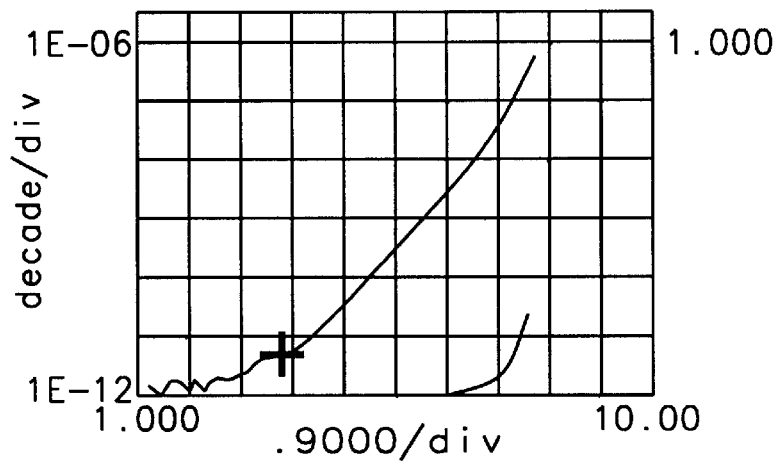
FIGS. 7A shows a graph for a polycide arrangement of FIG. 2 with no boron ESD implant.

FIG. 7A shows a graph for a polycide arrangement of FIG. 2 with no boron, B, ESD implant.

Figure 7B:
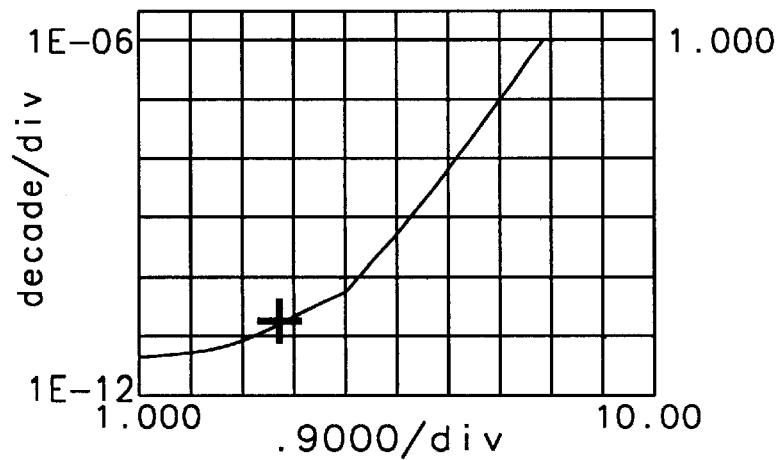
FIGS. 7B–7D show graphs for a polycide arrangement of FIG. 2 with boron ESD implants (B0), (B1), (B2).

FIG. 7B shows a graph for a polycide arrangement of FIG. 2 with a boron, B,ESD implant (B0).

Figure 7C:
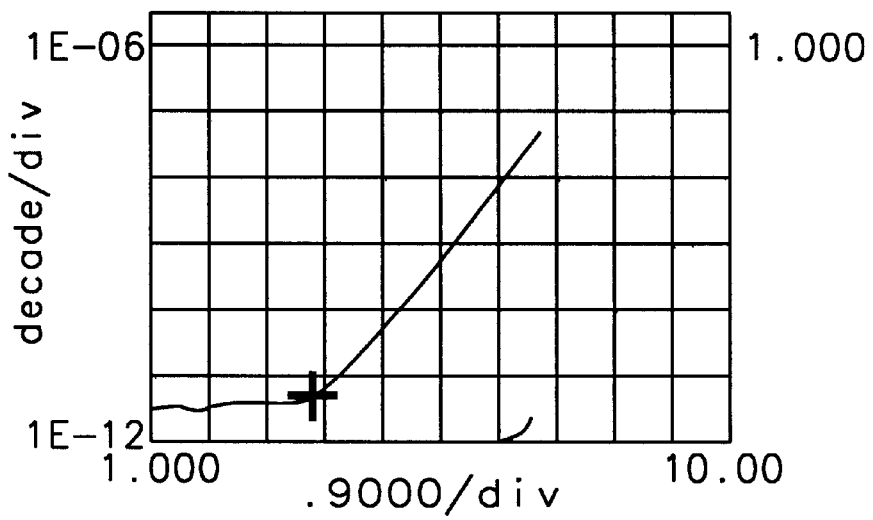

FIG. 7C shows a graph for a polycide arrangement of FIG. 2 with a boron, B, ESD implant (B1).

Figure 7D:
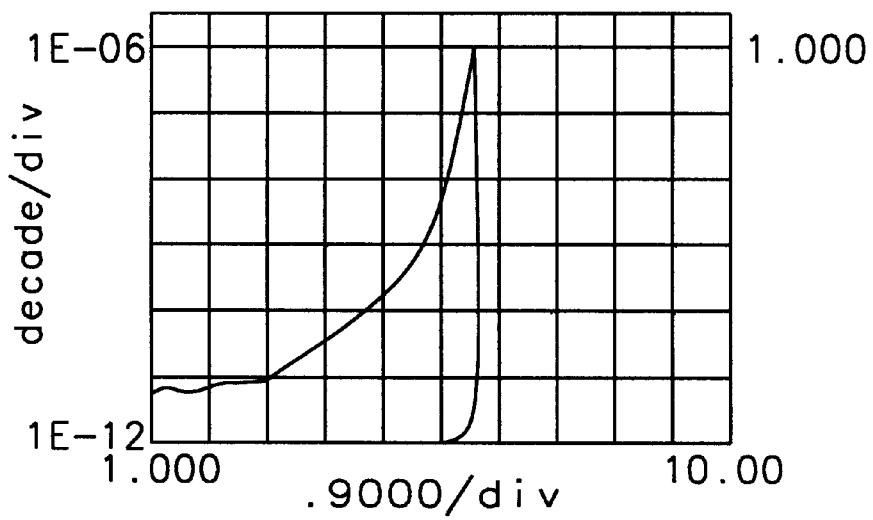

FIG. 7D shows a graph for a polycide arrangement of FIG. 2 with a boron, B, ESD implant (B2).

Summary of Features Shown in FIGS. 2 and 3

For NMOS
1. Add a N-type implant to the bottom of the drain/source regions.
2. Add a P-type implant to the bottom of the N-type implantation.

For PMOS
1. Add a P-type implant to the bottom of the drain/source
2. Add a N-type implant to the bottom of the P-type implantation.

This avoids the NMOS drain/source N+ junction might be overwhelmed by the P− implant and causes the junction spike to the substrate. Similarly it avoids overwhelming the PMOS drain/source P+ junction by the N− implant and causes the junction spike to the N-well. This reduces the breakdown voltage to enhance the ESD performance. The effective bipolar area is increased.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A semiconductor memory device formed on a semiconductor substrate with an N-well and a P-well comprising:

the combination of a gate oxide layer and a gate electrode layer patterned into gate electrode stacks with sidewalls formed over a substrate including an NMOS FET device over a P-well in said substrate and a PMOS FET device over aN-well, P− lightly doped source/drain regions formed in said N-well, N− lightly doped source/drain regions formed in said P-well, spacers formed on said sidewalls of said gate electrode stacks, N+ type source/drain regions in said P-well in said source/drain sites self-aligned with a said gate electrode stack, P+ type source/drain regions in said N-well in said source/drain sites self-aligned with a said gate electrode stack, heavily doped, counterdoped P++ regions formed directly below said P+ source/drain sites self-aligned with said gate electrode and said spacers in said N-well, heavily doped, counterdoped N++ regions formed directly below said N+ source/drain sites self-aligned with said gate electrode and said spacers in said P-well, deep N− lightly doped source/drain regions formed in said N-well directly below said counterdoped P++ regions, and deep P− lightly doped source/drain regions formed in said P-well directly below said counterdoped N++ regions.

2. The device of claim 1 including refractory metal silicide layers formed over said gate electrode layers.

3. The device of claim 1 including:

P−/N++ junctions are formed below said N+ source/drain regions in said P-well, and N−/P++ junctions are formed below said P+ source/drain regions in said N-well.

4. The device of claim 1 including:

P−/N++ junctions are formed below said N+ source/drain regions in said P-well, and N−/P++ junctions are formed below said P+ source/drain regions in said N-well.

5. The device of claim 1 including:

the deep lightly doped N− and P− regions are formed to a depth from about 2,000 Å to about 3,000 Å below the surface of the substrate, and the counterdoped N++ and counterdoped P++ regions are formed to a depth from about 1,000 Å to about 2,000 Å below the surface of the substrate.

6. The device of claim 1 including:

refractory metal silicide layers formed over said gate electrode layers, refractory metal silicide layers formed over said source/drain regions, P−/N++ junctions are formed below said N+ source/drain regions in said P-well, N−/P++ junctions are formed below said P+ source/drain regions in said N-well, the deep lightly doped N− and P− regions are formed to a depth from about 2,000 Å to about 3,000 Å below the surface of the substrate, and the counterdoped N++ and counterdoped P++ regions are formed to a depth from about 1,000 Å to about 2,000 Å below the surface of the substrate.

7. The device of claim 1 including:

refractory metal silicide layers formed over said source/drain regions,

P−/N++ junctions are formed below said N+ source/drain regions in said P-well, and N−/P++ junctions are formed below said P+ source/drain regions in said N-well.

8. The device of claim 1 including:

refractory metal silicide layers formed over said gate electrode layers, refractory metal silicide layers formed over said source/drain regions, P−/N++ junctions are formed below said N+ source/drain regions in said P-well, and N−/P++ junctions are formed below said P+ source/drain regions in said N-well.

9. The device of claim 8 including:

the deep lightly doped N− and P− regions are formed to a depth from about 2,000 Å to about 3,000 Å below the surface of the substrate, and the counterdoped N++ and counterdoped P++ regions are formed to a depth from about 1,000 Å to about 2,000 Å below the surface of the substrate.

10. The device of claim 1 including:

the deep lightly doped N− and P− regions are formed to a depth from about 2,000 Å to about 3,000 Å below the surface of the substrate, with a concentration of phosphorus dopant in the N− regions from about 1 E 17 atoms/cm$^3$ to about 1 E18 atoms/cm$^3$ and a concentration of boron dopant in the P− regions from about 1 E 17 atoms/cm$^3$ to about 1 E 18 atoms/cm$^3$, the counterdoped N++ and counterdoped P++ regions are formed to a depth from about 1,000 Å to about 2,000 Å below the surface of the substrate, with a concentration of phosphorus or arsenic dopant in the N++ regions from about 5 E 20 atoms/cm$^3$ to about 1 E 21 atoms/cm$^3$ and a concentration of boron dopant in the P++ regions from about 5 E 20 atoms/cm$^3$ to about 1 E 21 atoms/cm$^3$, with the S/D regions formed with a concentration of arsenic dopant in the N+ regions from about 1 E 20 atoms/cm$^3$ to about 5 E 20 atoms/cm$^3$ and a concentration of boron dopant in the P+ regions from about 1 E 20 atoms/cm$^3$ to about 5 E 20 atoms/cm$^3$, and with the lightly doped S/D regions formed with a concentration of phosphorus or arsenic dopant in the N− regions from about 1 E 18 atoms/cm$^3$ to about 1 E 20 atoms/cm$^3$ and a concentration of boron dopant in the P− regions from about 1 E18 atoms/cm$^3$ to about 1 E 20 atoms/cm$^3$.

* * * * *